United States Patent
Choi et al.

(10) Patent No.: US 9,782,799 B2
(45) Date of Patent: Oct. 10, 2017

(54) VIBRATION GENERATING APPARATUS

(71) Applicant: SAMSUNG ELECTRO-MECHANICS CO., LTD., Suwon-Si (KR)

(72) Inventors: Joon Choi, Suwon-Si (KR); Yeon Ho Son, Suwon-Si (KR)

(73) Assignee: MPLUS CO., LTD., Suwon-si, Gyeonggi-Do (KR)

( * ) Notice: Subject to any disclaimer, the term of this patent is extended or adjusted under 35 U.S.C. 154(b) by 441 days.

(21) Appl. No.: 14/601,244

(22) Filed: Jan. 21, 2015

(65) Prior Publication Data

US 2015/0251220 A1 Sep. 10, 2015

(30) Foreign Application Priority Data

Mar. 10, 2014 (KR) .................. 10-2014-0027811

(51) Int. Cl.
*H01L 41/053* (2006.01)
*B06B 1/06* (2006.01)
*H01L 41/09* (2006.01)

(52) U.S. Cl.
CPC .......... *B06B 1/0648* (2013.01); *H01L 41/053* (2013.01); *H01L 41/0933* (2013.01)

(58) Field of Classification Search
CPC ....................... H01L 41/053; H01L 41/0933
USPC ........................................................ 310/328
See application file for complete search history.

(56) References Cited

U.S. PATENT DOCUMENTS

| 2012/0212100 | A1 | 8/2012 | Lee | |
|---|---|---|---|---|
| 2012/0248935 | A1* | 10/2012 | Liu | H01L 41/0933 310/326 |
| 2012/0326568 | A1* | 12/2012 | Liu | G06F 3/016 310/348 |
| 2013/0300261 | A1* | 11/2013 | Kim | B06B 1/0603 310/348 |

FOREIGN PATENT DOCUMENTS

| JP | 11-78004 A | 3/1999 |
|---|---|---|
| JP | 2009022103 A | 1/2009 |
| JP | 2013078080 A | 4/2013 |
| KR | 10-2011-0045486 A | 5/2011 |
| KR | 101157868 B1 | 6/2012 |
| KR | 10-2012-0130994 A | 12/2012 |
| KR | 1020130125171 A | 11/2013 |

\* cited by examiner

*Primary Examiner* — Derek Rosenau
(74) *Attorney, Agent, or Firm* — LRK Patent Law Firm

(57) ABSTRACT

There is provided a vibration generating apparatus including: a housing having an internal space; a vibration member having both end portions thereof fixed to the housing; and a piezoelectric element installed on the vibration member, wherein the vibration member includes a first member having the piezoelectric element installed thereon and second members disposed at both end portions of the first member, the second members being formed of a material having a higher degree of tensile strength than the first member.

10 Claims, 5 Drawing Sheets

VIBRATION GENERATING APPARATUS

CROSS-REFERENCE TO RELATED APPLICATION

This application claims the priority and benefit of Korean Patent Application No. 10-2014-0027811 filed on Mar. 10, 2014, with the Korean Intellectual Property Office, the disclosure of which is incorporated in its entirety herein by reference.

BACKGROUND

The present disclosure relates to a vibration generating apparatus.

A vibration generating apparatus, converting electrical energy into mechanical vibrations using the principle of the generation of electromagnetic force, has been commonly been mounted in mobile phones, or the like, to be used for silently notifying a user of call reception by transferring vibrations thereto.

In addition, in accordance with the rapid expansion in the market for mobile devices such as mobile phones, and the like, mobile devices have been widely been implemented with increased functionality. In addition, the miniaturization of mobile devices has been demanded, along with improvements in the quality thereof.

In accordance with this trend, demand for development of a vibration generating apparatus having a novel structure capable of overcoming disadvantages of an existing vibration generating apparatus and significantly improving quality has increased.

Further, recently, mobile phones have largely been replaced by smartphones, and a touchscreen scheme has been adopted in the smart phone. Therefore, the use of a vibration generating apparatus has increased for the purpose of generating vibrations for user feedback at the time of a touch.

In addition, recently, a vibration generating apparatus using a piezoelectric element has been released onto the market. The vibration generating apparatus, which uses the principle of an inverse piezoelectric effect in generating displacement by applying voltage to the piezoelectric element, allows a mass body of a mover to move by the generated displacement to generate vibrational force.

In the vibration generating apparatus having the above-mentioned structure, a bandwidth of a frequency at which vibration force of a predetermined level or more may be obtained is wide, such that stable vibration characteristics may be implemented.

Meanwhile, the piezoelectric element is installed on a vibration member. Here, the piezoelectric element is bonded to the vibration member through a thermosetting adhesive. That is, the piezoelectric element and the vibration member are attached to each other through the thermosetting adhesive having relative high coupling force in order to prevent separation between the piezoelectric element and the vibration member. In addition, the thermosetting adhesive has a feature of being hardenable at high temperature.

Heat is applied in order to harden the thermosetting adhesive for attaching the piezoelectric element and the vibration member to each other. However, in this case, there may be a problem in that the vibration member may be deformed and bent due to a difference in a coefficient of thermal expansion between the piezoelectric element and the vibration member.

In order to solve this problem, the vibration member may be formed of a material having a low coefficient of thermal expansion (for example, a material containing 36 wt % or more of nickel). However, the vibration member is formed of the material having the low coefficient of thermal expansion as described above, such that the vibration member may be damaged at the time of vibrations.

Therefore, the development of a structure capable of preventing damage to the vibration member while maintaining coupling force between the piezoelectric element and the vibration member has been urgently demanded.

RELATED ART DOCUMENT (Patent Document 1) Korean Patent Laid-Open Publication No. 2011-45486

SUMMARY

An aspect of the present disclosure may provide a vibration generating apparatus capable of preventing damage to a vibration member.

According to an aspect of the present disclosure, a vibration generating apparatus may include: a housing having an internal space; a vibration member having both end portions thereof fixed to the housing; and a piezoelectric element installed on the vibration member, wherein the vibration member includes a first member having the piezoelectric element installed thereon and second members disposed at both end portions of the first member, the second members being formed of a material having a higher degree of tensile strength than the first member.

The piezoelectric element may be bonded to the first member through a thermosetting adhesive.

The first member may have stopper parts formed on both side surfaces thereof so as to support both side surfaces of the piezoelectric element.

The first member may have a lattice member formed on an upper surface thereof, the lattice member having a lattice shape.

The second member may have tensile strength 1.5 to 2 times larger than that of the first member.

The first member may have tensile strength of 36 to 835 N/mm$^2$.

The housing may include a case having an internal space and a lower end portion that is open and a bracket attached to the lower end portion of the case, and the bracket may have support parts protruding therefrom in order to support lower surfaces of both end portions of the vibration member.

The vibration generating apparatus may further include a mass body part disposed above the vibration member to increase a vibration amount.

The mass body part may include a mass body case having an internal space and a mass body inserted into the mass body case, and the mass body case may be installed above the vibration member through an adhering member.

BRIEF DESCRIPTION OF DRAWINGS

The above and other aspects, features and other advantages of the present disclosure will be more clearly understood from the following detailed description taken in conjunction with the accompanying drawings, in which.

DETAILED DESCRIPTION

Figure 1:
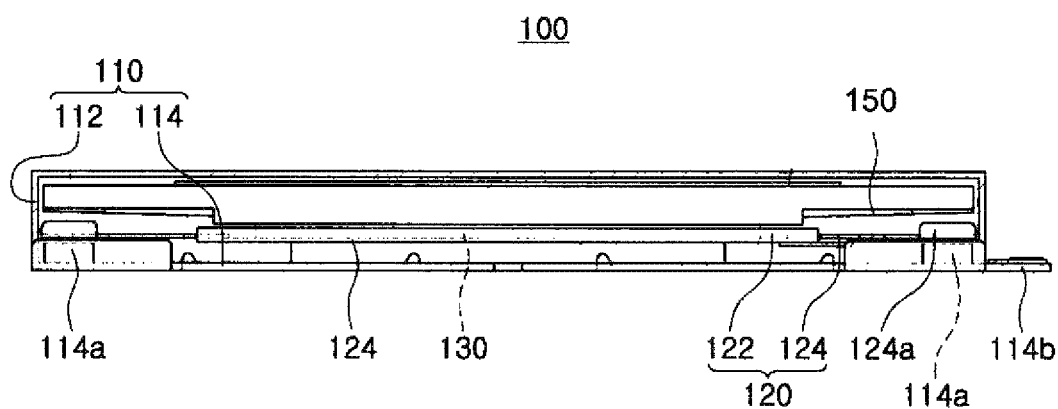
FIG. 1 is a schematic cross-sectional view illustrating a vibration generating apparatus according to an exemplary embodiment of the present disclosure.

Hereinafter, embodiments of the present disclosure will be described in detail with reference to the accompanying drawings.

The disclosure may, however, be embodied in many different forms and should not be construed as being limited to the embodiments set forth herein. Rather, these embodiments are provided so that this disclosure will be thorough and complete, and will fully convey the scope of the disclosure to those skilled in the art.

In the drawings, the shapes and dimensions of elements may be exaggerated for clarity, and the same reference numerals will be used throughout to designate the same or like elements.

Figure 2:
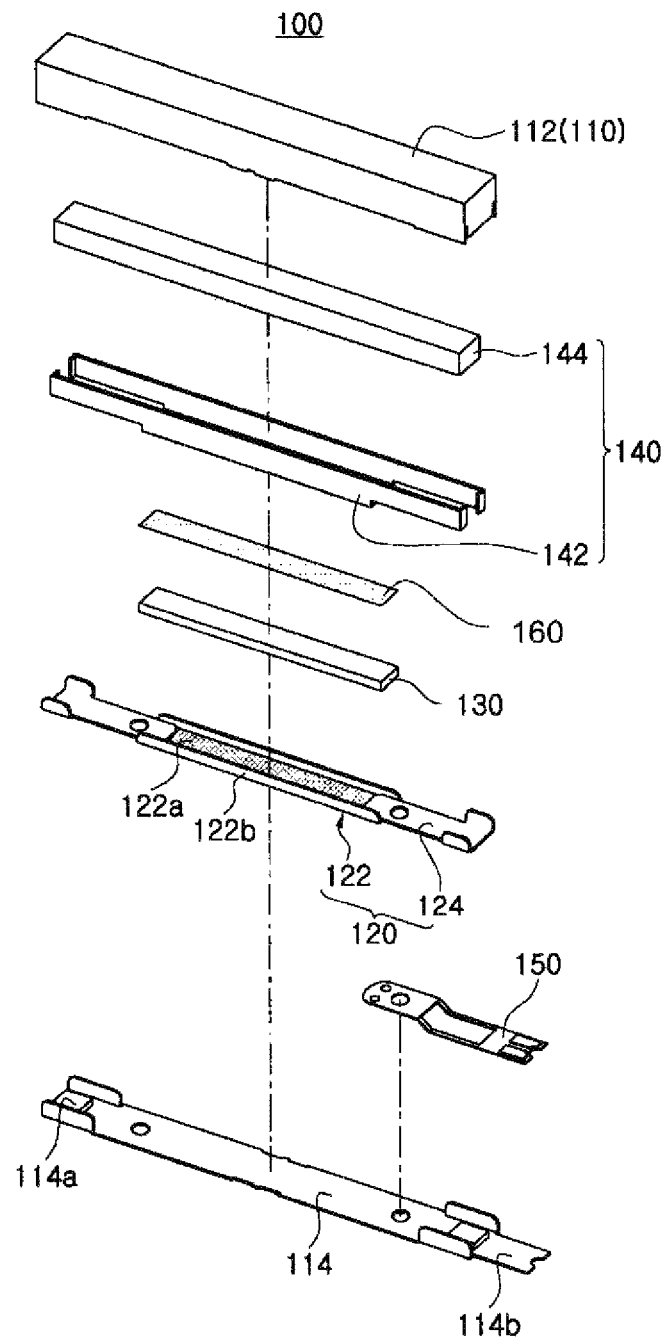
FIG. 2 is an exploded perspective view illustrating the vibration generating apparatus according to an exemplary embodiment of the present disclosure.

FIG. 1 is a schematic cross-sectional view illustrating a vibration generating apparatus according to an exemplary embodiment of the present disclosure; FIG. 2 is an exploded perspective view illustrating the vibration generating apparatus according to an exemplary embodiment of the present disclosure; and FIG. 3 is a perspective view illustrating a vibration member included in the vibration generating apparatus according to an exemplary embodiment of the present disclosure.

Figure 3:
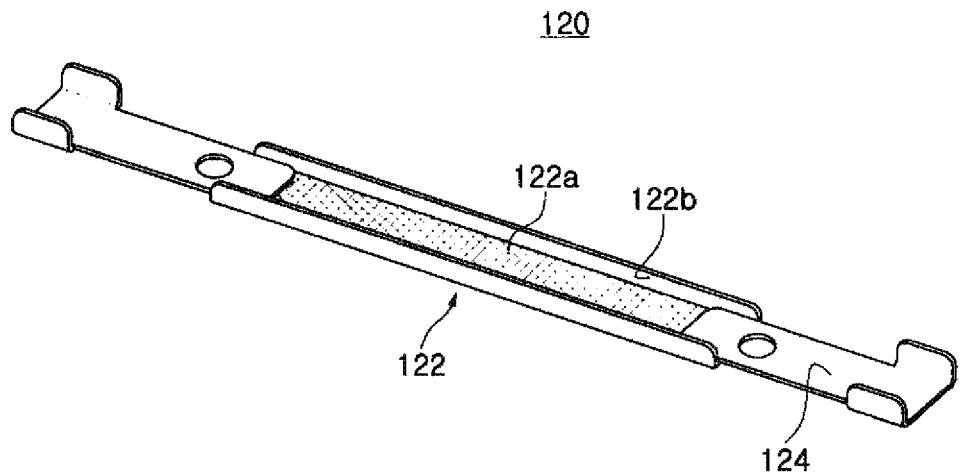
FIG. 3 is a perspective view illustrating a vibration member included in the vibration generating apparatus according to an exemplary embodiment of the present disclosure.

Referring to FIGS. 1 through 3, a vibration generating apparatus 100 according to an exemplary embodiment of the present disclosure may include a housing 110, a vibration member 120, a piezoelectric element 130, and a mass body part 140 by way of example.

The housing 110 may form an appearance of the vibration generating apparatus 100 and have an internal space so that the vibration member 120, the piezoelectric element 130, the mass body part 140, and the like, may be accommodated therein. To this end, the housing 110 may include a case 112 having an internal space and having a box shape in which a lower end portion thereof is opened, and a bracket 114 attached to the lower end portion of the case 112.

Meanwhile, the case 112 may have a rectangular parallelepiped shape, and the bracket 114 may have a plate shape. That is, the bracket 114 may be attached to the lower end portion of the case 112 to form the housing 110.

Although the case in which the housing 110 has the rectangular parallelepiped shape has been described by way of example in the present exemplary embodiment, a shape of the housing 110 is not limited thereto, but may be variously changed.

In addition, the bracket 114 may have support parts 114a formed in order to support both end portions of the vibration member 120. The support parts 114a may be formed by denting, and may have flat upper surfaces so as to stably support a lower surface of the vibration member 120.

Meanwhile, the case 112 and the bracket 114 may be attached to each other by welding.

The vibration member 120 may have both end portions thereof fixed to the housing 110. As an example, the vibration member 120 may be installed on the support parts 114a of the bracket 114. That is, the vibration member 120 may be installed so that lower surfaces of both end portions thereof are seated on the upper surfaces of the support parts 114a of the bracket 114, and the vibration member 120 and the bracket 114 may be bonded to each other by welding.

Although the case in which the vibration member 120 is fixed to the bracket 114 has been described by way of example in the present exemplary embodiment, the present disclosure is not limited thereto. That is, the vibration member 120 may also be fixed to the case 112.

Meanwhile, the vibration member 120 may include a first member 122 having the piezoelectric element 130 installed thereon and second members 124 attached to both end portions of the first member 122. Meanwhile, the second members 124 may be formed of a material having a higher degree of tensile strength than the first member 122.

In addition, the first member 122 may have a length longer than that of the piezoelectric element 130. That is, the first member 122 may be formed at the length longer than that of the piezoelectric element 130 in order to be bonded to the second members 124. As an example, in the case in which the piezoelectric element 130 has a length of 17 mm, the first member 122 may have a length of at least 18.6 mm.

In addition, the first member 122 may be bonded to the piezoelectric element 130 through a thermosetting adhesive. Further, the first member 122 may have a lattice member 122a formed on an upper surface thereof in order to increase coupling force between the first member 122 and the piezoelectric element 130, wherein the lattice member 122a has a lattice shape. The lattice member 122a may serve to increase a space in which the adhesive is accommodated to prevent the piezoelectric element 130 from being separated from the first member 122 at the time of deformation of the piezoelectric element 130.

In addition, the first member 122 may have stopper parts 122b formed on both side surfaces thereof so as to support both side surfaces of the piezoelectric element 130 at the time of assembling the piezoelectric element 130. The stopper parts 122b may serve to prevent the adhesive applied to the first member 122 from being leaked to the outside simultaneously with guiding a position at which the piezoelectric element 130 is installed.

Meanwhile, the first member 122 may be formed of a material having a low coefficient of thermal expansion so as to be reduced from being deformed due to heat applied at the time of hardening the thermosetting adhesive. As an example, the first member 122 may be formed of an alloy containing approximately 36 wt % or more of nickel.

In addition, as an example, the first member 122 may have tensile strength of approximately 36 to 835 N/mm$^2$.

Therefore, the first member 122 and the piezoelectric element 130 may be more firmly coupled to each other, and the deformation of the first member 122 due to the heat applied at the time of hardening the adhesive may be reduced.

The second members 124 may be coupled to both end portions of the first member 122. Meanwhile, the second member 124 may have tensile strength 1.5 to 2 times larger than that of the first member 122. To this end, the second member 124 may be formed of stainless steel (SUS). As an example, the second member 124 may have tensile strength of approximately 1200 N/mm².

Meanwhile, in the case which the second member 124 has tensile strength 2 times or more larger than that of the first member 122, a driving frequency may become high, such that a vibration amount may be decreased, and in the case in which the second member 124 has tensile strength 1.5 times or less larger than that of the first member 122, damage may occur.

As described above, since the tensile strength of the second member 124 is larger than that of the first member 122, the coupling force between the piezoelectric element 130 and the first member may be maintained, and the damage to the second member 124 at the time of vibrations may be prevented.

Meanwhile, the second member 124 and the first member 122 may be bonded to each other by at least one of a welding method and an adhering method.

The piezoelectric element 130 may be installed on the vibration member 120 and be deformed in the case in which power is applied thereto. That is, the piezoelectric element 130 may be installed on the lattice member 122a of the first member 122 described above through the thermosetting adhesive. In addition, the piezoelectric element 130 may be installed so that both side surfaces thereof are supported by the stopper parts 122b of the first member 122.

Meanwhile, the piezoelectric element 130 may include at least one pair of external electrodes (not shown), which may include a positive (+) electrode and a negative (−) electrode. Therefore, when the power is applied to the piezoelectric element 130, the piezoelectric element 130 may be deformed. As a result, a central portion of the vibration member 120 may vertically vibrate.

In addition, the piezoelectric element 130 may have a circuit board 150 connected thereto, wherein the circuit board 150 may be a flexible printed circuit board.

The mass body part 140 may be disposed above the vibration member 120 to serve to increase a vibration amount. Meanwhile, the mass body part 140 may be installed on an upper surface of the piezoelectric element 130 through an adhering member 160.

In addition, the mass body part 140 may include a mass body case 142 having a box shape in which an upper portion thereof is opened and a mass body 144 installed in the mass body case 142.

Further, the mass body case 142 and the piezoelectric element 130 may have the adhering member 160 installed therebetween. In addition, the adhering member 160 may be formed of an adhering tape.

Meanwhile, a damper member (not shown) may be installed on at least one of the mass body 144 and an inner surface of the case 112 in order to prevent generation of noise and damage to the case 112 due to a contact between the mass body 144 and the case 112.

As described above, the second member 124 may be formed of the material having the a higher degree of tensile strength than the first member 122 on which the piezoelectric element 130 is installed, such that the damage to the second member 124 at the time of generation of the vibrations or external impact may be reduced.

Further, the first member 122 may be formed of the material having the low coefficient of thermal expansion, such that the coupling force between the first member 122 and the piezoelectric element 130 may be increased, and twisting of the first member 122 may be prevented.

That is, the first member 122 may be formed of the material having the low coefficient of thermal expansion, such that the deformation of the first member 122 due to the heat applied at the time of hardening the thermosetting adhesive may be reduced.

Hereinafter, a vibration generating apparatus according to another exemplary embodiment of the present disclosure will be described with reference to the accompanying drawings.

Figure 4:
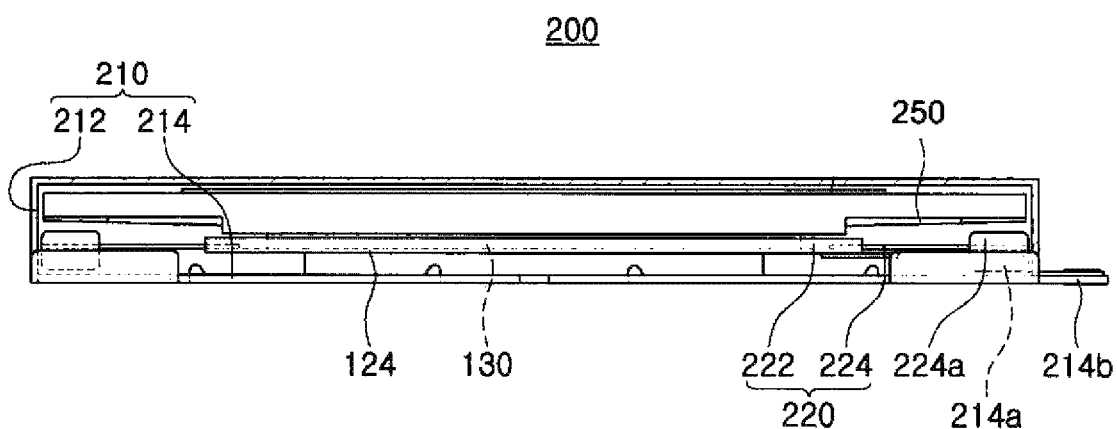
FIG. 4 is a schematic cross-sectional view illustrating a vibration generating apparatus according to another embodiment of the present disclosure.
Figure 5:
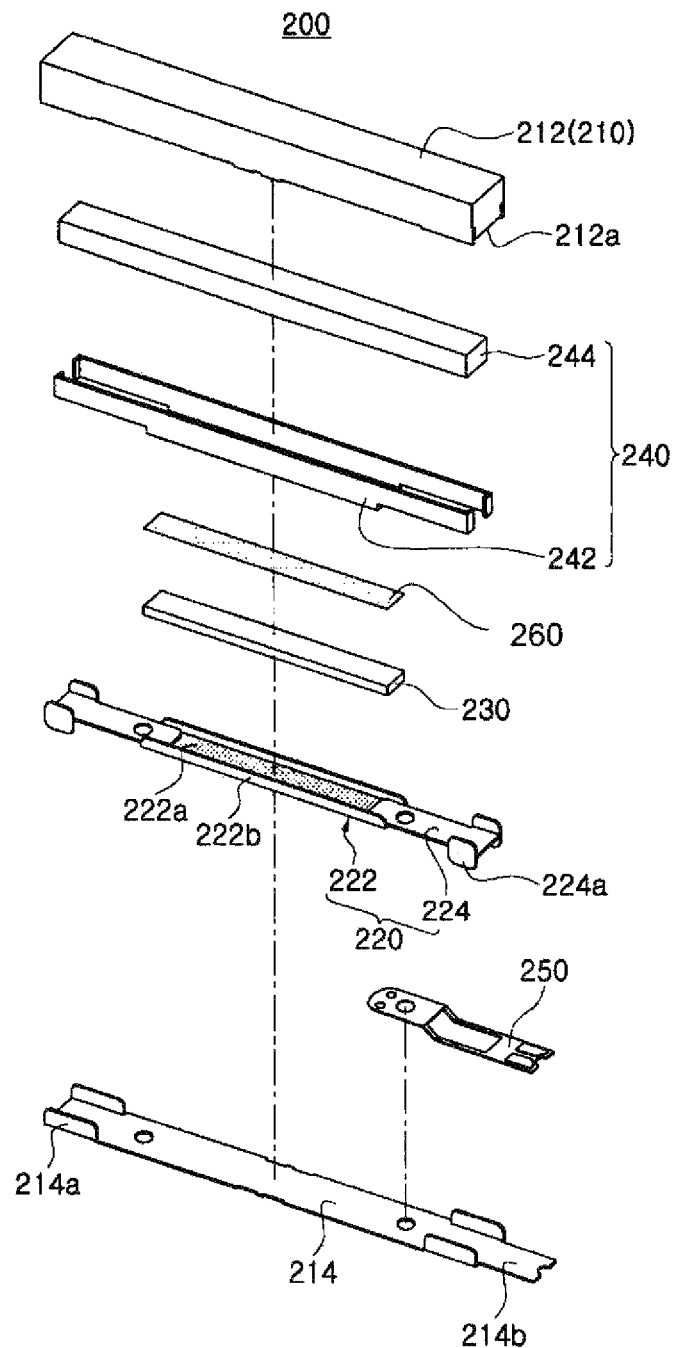
FIG. 5 is an exploded perspective view illustrating the vibration generating apparatus according to another exemplary embodiment of the present disclosure.

FIG. 4 is a schematic cross-sectional view illustrating a vibration generating apparatus according to another embodiment of the present disclosure; FIG. 5 is an exploded perspective view illustrating the vibration generating apparatus according to another exemplary embodiment of the present disclosure; and FIG. 6 is a perspective view illustrating a vibration member included in the vibration generating apparatus according to another exemplary embodiment of the present disclosure.

Figure 6:
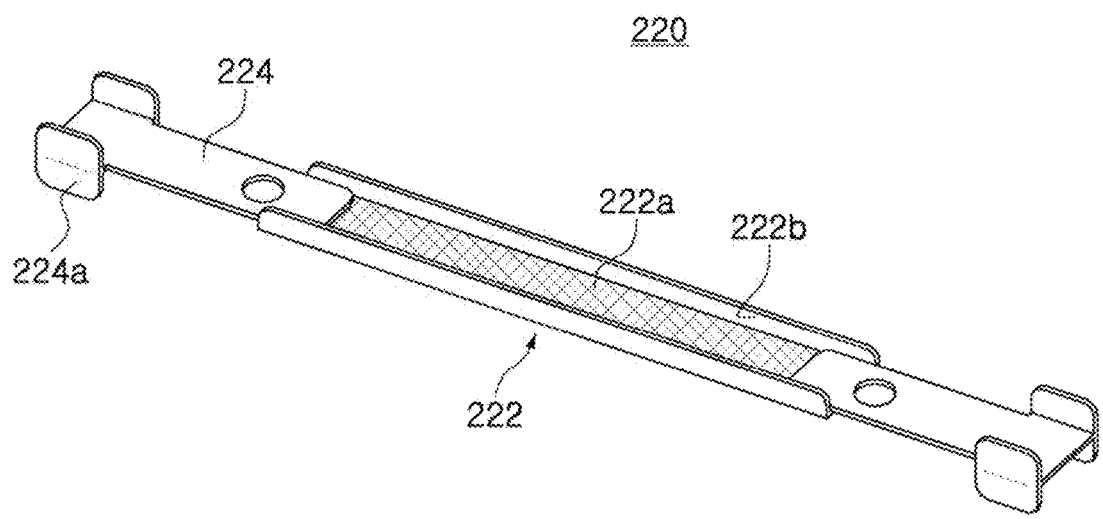
FIG. 6 is a perspective view illustrating a vibration member included in the vibration generating apparatus according to another exemplary embodiment of the present disclosure.

Referring to FIGS. 4 through 6, a vibration generating apparatus 200 according to another exemplary embodiment of the present disclosure may include a housing 210, a vibration member 220, a piezoelectric element 230, and a mass body part 240 by way of example.

The housing 210 may form an appearance of the vibration generating apparatus 200 and have an internal space so that the vibration member 220, the piezoelectric element 230, the mass body part 240, and the like, may be accommodated therein.

To this end, the housing 210 may include a case 212 having an internal space and having a box shape in which a lower end portion thereof is opened, and a bracket 214 attached to the lower end portion of the case 212.

Meanwhile, the case 212 may have a rectangular parallelepiped shape, and the bracket 214 may have a plate shape. That is, the bracket 214 may be attached to the lower end portion of the case 212 to form the housing 210.

Although the case in which the housing 210 has the rectangular parallelepiped shape has been described by way of example in the present exemplary embodiment, a shape of the housing 210 is not limited thereto, but may be variously changed.

In addition, the case 212 may have a withdrawal groove 212a formed in one end surface thereof in order to withdraw a circuit board 250.

In addition, the bracket 214 may be provided with an installation part 214b on which one side of the circuit board 250 withdrawn from the housing 210 to the outside is seated, wherein the installation part 214b may be disposed at an outer portion of the case 212.

Meanwhile, the bracket 214 may have bonded parts 214a formed at both end portions thereof and bent in order to install the vibration member 220 thereon. The bonded parts 214a may be formed on both side surfaces of the bracket 214, respectively, and may contact inner surfaces of the case 212 at the time of assembling the case 212 and the bracket 214 to each other.

In addition, the bonded part 214a may have a length longer than that of a bent part 224a of a vibration member 220 to be described below.

The vibration member 220 may have both end portions thereof fixed to the housing 210. Meanwhile, the vibration member 220 may have a plate shape, and may have both end portions thereof fixed, such that the vibration member 220 vibrates vertically at the time of deformation of the piezoelectric element 230.

Although the case in which the vibration member 220 is fixed to the bracket 214 has been described by way of example in the present exemplary embodiment, the present disclosure is not limited thereto. That is, the vibration member 220 may also be fixed to the case 212.

Meanwhile, the vibration member 220 may include a first member 222 having the piezoelectric element 230 installed thereon and second members 224 attached to both end portions of the first member 222. Meanwhile, the second members 224 may be formed of a material having a higher degree of tensile strength than the first member 222.

In addition, the first member 222 may have a length longer than that of the piezoelectric element 230. That is, the first member 222 may be formed at the length longer than that of the piezoelectric element 230 in order to be bonded to the second members 224. As an example, in the case in which the piezoelectric element 230 has a length of 17 mm, the first member 222 may have a length of at least 18.6 mm.

In addition, the first member 222 may be bonded to the piezoelectric element 230 through a thermosetting adhesive. Further, the first member 222 may have a lattice member 222a formed on an upper surface thereof in order to increase coupling force between the first member 222 and the piezoelectric element 230, wherein the lattice member 222a has a lattice shape. The lattice member 222a may serve to increase a space in which the adhesive is accommodated to prevent the piezoelectric element 230 from being separated from the first member 222 at the time of deformation of the piezoelectric element 230.

In addition, the first member 222 may have stopper parts 222b formed on both side surfaces thereof so as to support both side surfaces of the piezoelectric element 230 at the time of assembling the piezoelectric element 230. The stopper parts 222b may serve to prevent the adhesive applied to the first member 222 from being leaked to the outside simultaneously with guiding a position at which the piezoelectric element 230 is installed.

Meanwhile, the first member 222 may be formed of a material having a low coefficient of thermal expansion so as to be reduced from being deformed due to heat applied at the time of hardening the thermosetting adhesive. As an example, the first member 222 may be formed of an alloy containing approximately 36 wt % or more of nickel.

In addition, as an example, the first member 222 may have tensile strength of approximately 36 to 835 $N/mm^2$.

Therefore, the first member 222 and the piezoelectric element 230 may be more firmly coupled to each other, and the deformation of the first member 222 due to the heat applied at the time of hardening the adhesive may be reduced.

The second members 224 may be coupled to both end portions of the first member 222. Meanwhile, the second member 224 may have tensile strength 1.5 to 2 times larger than that of the first member 222. To this end, the second member 224 may be formed of stainless steel (SUS). As an example, the second member 224 may have tensile strength of approximately 1200 $N/mm^2$.

Meanwhile, in the case which the second member 224 has tensile strength 2 times or more larger than that of the first member 222, a driving frequency may become high, such that a vibration amount may be decreased, and in the case in which the second member 224 has tensile strength 1.5 times or less larger than that of the first member 222, damage may occur.

As described above, since the second member 224 has the tensile strength 1.5 times to 2 times larger than that of the first member 222, the coupling force between the piezoelectric element 230 and the first member 222 may be maintained, and the damage to the second member 224 at the time of vibrations may be prevented.

Meanwhile, the second member 224 and the first member 222 may be bonded to each other by at least one of a welding method and an adhering method.

In addition, the second members 224 may have bent parts 224a formed at end portions thereof, wherein the bent parts 224a are bonded to the bonded parts 214a of the bracket 214. In addition, the bent parts 224a may be bonded to the bonded parts 214a of the bracket 214 by at least one of a welding method and an adhering method.

In addition, outer surfaces of the bent parts 224a may be bonded to inner surfaces of the bonded parts 214a.

As described above, the vibration member 220 may be installed in the housing 210 by the bent parts 224a, such that the vibration member 220 may be maintained in a state in which lower portions of both end portions thereof are opened.

The piezoelectric element 230 may be installed on one surface of the vibration member 220. As an example, the piezoelectric element 230 may be installed on an upper surface of the vibration member 220, that is, an upper surface of the first member 222.

Meanwhile, the piezoelectric element 230 may be deformed in the case in which power is applied thereto, thereby serving to vibrate the vibration member 220. To this end, the piezoelectric element 230 may include at least one pair of external electrodes (not shown), which may include a positive (+) electrode and a negative (−) electrode.

The mass body part 240 may be disposed above the vibration member 220 to serve to increase a vibration amount. Meanwhile, the mass body part 240 may be installed on an upper surface of the piezoelectric element 230 through an adhering member 260.

In addition, the mass body part 240 may include a mass body case 242 having a box shape in which an upper portion thereof is opened and a mass body 244 installed in the mass body case 242.

Further, the mass body case 242 and the piezoelectric element 230 may have the adhering member 260 installed therebetween. In addition, the adhering member 260 may be formed of an adhering tape.

Meanwhile, a damper member (not shown) may be installed on at least one of the mass body 244 and the inner surface of the case 212 in order to prevent generation of noise and damage to the case 212 due to a contact between the mass body 244 and the case 212.

As described above, the second member 224 may be formed of the material having the a higher degree of tensile strength than the first member 222 on which the piezoelectric element 230 is installed, such that the damage to the second member 224 at the time of generation of the vibrations or external impact may be reduced.

Further, the first member 222 may be formed of the material having the low coefficient of thermal expansion, such that the coupling force between the first member 222 and the piezoelectric element 230 may be increased, and twisting of the first member 222 may be prevented.

That is, the first member 222 may be formed of the material having the low coefficient of thermal expansion, such that the deformation of the first member 222 due to the heat applied at the time of hardening the thermosetting adhesive may be reduced.

Further, since the vibration member 220 may be maintained in the state in which the lower portions of both end portions thereof are opened, space utilization may be increased.

As set forth above, according to exemplary embodiments of the present disclosure, the second member may be formed of the material having the a higher degree of tensile strength than the first member on which the piezoelectric element is installed, such that the damage to the second member at the time of the generation of the vibrations or the external impact may be reduced.

Further, the first member may be formed of the material having the low coefficient of thermal expansion, such that the coupling force between the first member and the piezoelectric element may be increased, and the twisting of the first member may be prevented.

That is, the first member may be formed of the material having the low coefficient of thermal expansion, such that the deformation of the first member due to the heat applied at the time of hardening the thermosetting adhesive may be reduced.

While exemplary embodiments have been shown and described above, it will be apparent to those skilled in the art that modifications and variations could be made without departing from the scope of the present invention as defined by the appended claims.

What is claimed is:

1. A vibration generating apparatus comprising:
   a housing having an internal space;
   a vibration member having both end portions thereof fixed to the housing; and
   a piezoelectric element installed on the vibration member,
   wherein the vibration member includes a first member having the piezoelectric element installed thereon and second members disposed at both end portions of the first member, and
   the second members are formed of a material having a higher degree of tensile strength than the first member.

2. The vibration generating apparatus of claim 1, wherein the piezoelectric element is bonded to the first member through a thermosetting adhesive.

3. The vibration generating apparatus of claim 1, wherein the first member has stopper parts formed on both side surfaces thereof so as to support both side surfaces of the piezoelectric element.

4. The vibration generating apparatus of claim 3, wherein the first member has a lattice member formed on an upper surface thereof, the lattice member having a lattice shape.

5. The vibration generating apparatus of claim 1, wherein the second member has tensile strength 1.5 to 2 times larger than that of the first member.

6. The vibration generating apparatus of claim 5, wherein the first member has tensile strength of 36 to 835 $N/mm^2$.

7. The vibration generating apparatus of claim 1, wherein the housing includes a case having an internal space and a lower end portion that is open and a bracket attached to the lower end portion of the case, and
   the bracket has support parts protruding therefrom in order to support lower surfaces of both end portions of the vibration member.

8. The vibration generating apparatus of claim 1, further comprising a mass body part disposed above the vibration member to increase a vibration amount.

9. The vibration generating apparatus of claim 8, wherein the mass body part includes a mass body case having an internal space and a mass body inserted into the mass body case, and
   the mass body case is installed above the vibration member through an adhering member.

10. A vibration generating apparatus comprising:
    a housing including a case having an internal space and a lower end portion that is open and a bracket attached to the lower end portion of the case;
    a vibration member having both end portions thereof fixed to the housing;
    a piezoelectric element installed on the vibration member; and
    a mass body part installed above the vibration member through an adhering member,
    wherein the vibration member includes a first member having the piezoelectric element installed thereon and second members disposed at both end portions of the first member, and
    the second members are formed of a material having a higher degree of tensile strength than the first member.

* * * * *